(12) United States Patent
Wang et al.

(10) Patent No.: US 11,887,844 B2
(45) Date of Patent: Jan. 30, 2024

(54) SOLAR CELL AND PRODUCTION METHOD THEREOF, PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Zhao Wang, Zhejiang (CN); Jie Yang, Zhejiang (CN); Mengchao Shen, Zhejiang (CN); Lipeng Wang, Zhejiang (CN)

(73) Assignees: ZHEJIANG JINKO SOLAR CO., LTD., Haining Zhejiang (CN); JINKO SOLAR CO., LTD., Jiangxi (CN)

( * ) Notice: Subject to any disclaimer, the term of this patent is extended or adjusted under 35 U.S.C. 154(b) by 37 days.

(21) Appl. No.: 17/873,110

(22) Filed: Jul. 25, 2022

(65) Prior Publication Data

US 2023/0402552 A1 Dec. 14, 2023

(30) Foreign Application Priority Data

Jun. 10, 2022 (CN) .......................... 202210656583.8

(51) Int. Cl.
*H01L 31/0216* (2014.01)
*H01L 31/05* (2014.01)
(Continued)

(52) U.S. Cl.
CPC .. *H01L 31/02167* (2013.01); *H01L 31/02363* (2013.01); *H01L 31/03125* (2013.01); *H01L 31/0508* (2013.01)

(58) Field of Classification Search
CPC ......... H01L 31/02167; H01L 31/02363; H01L 31/03125; H01L 31/0508
See application file for complete search history.

(56) References Cited

U.S. PATENT DOCUMENTS

| 9,252,305 B2* | 2/2016 | Hamamoto | ....... H01L 31/03529 |
| 9,412,888 B2* | 8/2016 | Chung | ................ H01L 31/1804 |

(Continued)

FOREIGN PATENT DOCUMENTS

| CN | 103219428 A | 7/2013 |
| CN | 104465867 A | 3/2015 |

(Continued)

OTHER PUBLICATIONS

Zhejiang Jinko Solar Co., Ltd., et al., JP Notice of Reasons for Refusal with English translation, JP 2022-117611, dated Sep. 7, 2022, 11 pgs.

(Continued)

*Primary Examiner* — Golam Mowla
(74) *Attorney, Agent, or Firm* — USCH Law, PC

(57) ABSTRACT

Embodiments of the present disclosure relates to the field of solar cells, and in particular to a solar cell and a production method thereof, and a photovoltaic module. The solar cell includes: a P-type emitter formed on a first surface of an N-type substrate and including a first portion and a second portion, a top surface of the first portion includes first pyramid structures, and a top surface of the second portion includes second pyramid structures whose edges are straight. A transition surface is respectively formed on at least one edge of each first pyramid structure, and each of top surfaces of at least a part of the first pyramid structures includes a spherical or spherical-like substructure. A tunnel layer and a doped conductive layer sequentially formed over a second surface of the N-type substrate. The present disclosure can improve the photoelectric conversion performance of solar cells.

20 Claims, 6 Drawing Sheets

(51) Int. Cl.
H01L 31/0312 (2006.01)
H01L 31/0236 (2006.01)

(56) References Cited

U.S. PATENT DOCUMENTS

| | | | |
|---|---|---|---|
| 9,871,146 B2 * | 1/2018 | Shim | H01L 31/02168 |
| 2011/0139236 A1 * | 6/2011 | Lee | H01L 31/02363 |
| | | | 257/E31.13 |
| 2012/0132264 A1 | 5/2012 | Chen et al. | |

FOREIGN PATENT DOCUMENTS

| | | | | |
|---|---|---|---|---|
| CN | 103560170 B | 7/2016 | | |
| CN | 111628047 A | 9/2020 | | |
| CN | 112349809 A | 2/2021 | | |
| CN | 113675298 A | 11/2021 | | |
| CN | 113707761 A | 11/2021 | | |
| CN | 114203855 A | 3/2022 | | |
| EP | 2680313 A2 | 1/2014 | | |
| JP | 2011233875 A | 11/2011 | | |
| JP | 5019397 B2 | 9/2012 | | |
| JP | 2015122435 A | 7/2015 | | |
| JP | 2018120979 A | 8/2018 | | |
| JP | 7082235 B1 | 6/2022 | | |
| KR | 20120023987 A * | 3/2012 | | H01L 31/0684 |
| KR | 20120032238 A * | 4/2012 | | H01L 31/02167 |
| KR | 20130082257 A * | 7/2013 | | H01L 31/022425 |
| WO | 2011140273 A2 | 11/2011 | | |
| WO | WO-2012025511 A1 * | 3/2012 | | H01L 31/02363 |
| WO | 2012134061 A2 | 10/2012 | | |
| WO | 2014083804 A1 | 6/2014 | | |

OTHER PUBLICATIONS

Zhejiang Jinko Solar Co., Ltd., et al., JP Decision to Grant with English translation, JP 2022-117611, dated Jan. 13, 2023, 5 pgs.

Zhejiang Jinko Solar Co., Ltd., et al., JP Decision to Grant with English translation, JP 2023-020019, dated Apr. 5, 2023, 5 pgs.

Christoph Schwab, et al., "Recombination and Optical Properties of Wet Chemically Polished Thermal Oxide Passivated Si Surfaces", IEEE Journal of Photovoltaics, IEEE, vol. 3, No. 2, Apr. 2013, 8 pgs.

J. Benick, et al., "Approaching 22% Efficiency With Multicrystalline N-Type Silicon Solar Cells", 33rd European Photovoltaic Solar Energy Conference and Exhibition, Proceedings of the International Conference, WIP—Renewable Energies, Sylvensteinstr. 2 81369 Munich, Germany, Sep. 25, 2017, 5 pgs.

Zhejiang Jinko Solar Co., Ltd., et al., GB Official Search Report, GB 2218322.2, dated Jan. 17, 2023, 2 pgs.

Zhejiang Jinko Solar Co., Ltd., et al., Extended European Search Report, EP 22185828.5, dated Dec. 23, 2022, 8 pgs.

T. Roeder et al., Fill Factor Loss of Laser Doped Textured Silicon Solar Cells, 23rd European Photovoltaic Solar Energy Conference, Sep. 1-5, 2008, Valencia, Spain, Nov. 11, 2015, 3 pgs. URL:https://www.researchgate.net/publication/269328032_Fill_Factor_of_Laser_Doped_Textured_Silicon_Solar_Cells.

* cited by examiner

SOLAR CELL AND PRODUCTION METHOD THEREOF, PHOTOVOLTAIC MODULE

CROSS REFERENCE TO RELATED APPLICATIONS

The present application claims the benefit of priority under the Paris Convention to Chinese Patent Application No. 202210656583.8 filed on Jun. 10, 2022, which is incorporated herein by reference in its entirety.

TECHNIC FIELD

Embodiments of the present disclosure relates to the field of solar cells, and in particular to a solar cell and a production method for the solar cell, and a photovoltaic module.

BACKGROUND

Solar cells have good photoelectric conversion capabilities. In solar cells, a diffusion process is required on the surface of silicon wafers to produce p-n junctions. In existing solar cells, boron diffusion processes are usually performed on the surface of silicon wafers to form an emitter on the surface of silicon wafers. On one hand, the emitter forms a p-n junction with the silicon wafer, and on the other hand, the emitter is also electrically connected with a metal electrode, so that the carriers transporting in the emitter can be collected by the metal electrode. Therefore, the emitter has a great influence on the photoelectric conversion performance of the solar cells.

The photoelectric conversion performance of the existing solar cells is poor.

SUMMARY

Embodiments of the present disclosure provide a solar cell and a production method thereof, and a photovoltaic module, which is at least conducive to the improvement of photoelectric conversion performance of a solar cell.

Some embodiments of the present disclosure provide a solar cell, including: an N-type substrate, a P-type emitter formed on a first surface of the N-type substrate, and a tunnel layer and a doped conductive layer sequentially formed over a second surface of the N-type substrate in a direction away from the N-type substrate. The P-type emitter includes a first portion and a second portion, the first portion has first pyramid structures formed on a top surface of the first portion and the second portion has second pyramid structures formed on a top surface of the second portion. A transition surface is respectively formed on at least one edge of each first pyramid structure, the transition surface is joined with two adjacent inclined surfaces of the each first pyramid structure, and the transition surface is concave or convex relative to a center of the each first pyramid structure. A substructure is formed on each of top surfaces of at least a part of the first pyramid structures, and a shape of the substructure is spherical or spherical-like. Edges of each second pyramid structure are straight. A sheet resistance of the first portion ranges from 10 ohm/sq to 500 ohm/sq, a doping concentration at the top surface of the first portion ranges from $1E^{17}$ atoms/cm$^3$ to $8E^{19}$ atoms/cm$^3$. A sheet resistance of the second portion ranges from 100 ohm/sq to 1000 ohm/sq, and a doping concentration at the top surface of the second portion ranges from $1E^{16}$ atoms/cm$^3$ to $5E^{19}$ atoms/cm$^3$.

In an example, heights of the first pyramid structures range from 0.1 μm to 5 μm, and sizes of bottoms of the first pyramid structures range from 0.5 μm to 5 μm in any one dimension.

In an example, a doping element in the first portion of the P-type emitter is of a same conductivity type as a doping element in the second portion of the P-type emitter, and the doping element in the first portion and the doping element in the second portion are each a trivalent element.

In an example, the doping element in the first portion and the doping element in the second portion each include boron or gallium.

In an example, the sheet resistance of the first portion is lower than the sheet resistance of the second portion.

In an example, the doping concentration at the top surface of the first portion is not less than the doping concentration at the top surface of the second portion.

In an example, a junction depth of the first portion is not less than a junction depth of the second portion.

In an example, a ratio of the junction depth of the first portion to the junction depth of the second portion is not less than 2.

In an example, the junction depth of the first portion ranges from 0.2 μm to 10 μm, and the junction depth of the second portion ranges from 0.05 μm to 5 μm.

In an example, a difference between the doping concentration at the top surface of the first portion and a doping concentration at a bottom surface of the first portion ranges from $8E^{19}$ atoms/cm$^3$ to $1E^{17}$ atoms/cm$^3$.

In an example, a difference between the doping concentration at the top surface of the second portion and a doping concentration at a bottom surface of the second portion ranges from $5E^{19}$ atoms/cm$^3$ to $1E^{16}$ atoms/cm$^3$.

In an example, at least a part of at least one inclined surface of the each first pyramid structure is concave or convex relative to a center of the each first pyramid structure.

In an example, the solar cell further includes a first metal electrode, where the first metal electrode is formed on the first surface of the N-type substrate, and is electrically connected to the first portion of the P-type emitter.

In an example, a width of the first metal electrode is less than or equal to a width of the first portion of the P-type emitter.

Some embodiments of the present disclosure provide a production method for a solar cell, including: providing an N-type substrate, forming a P-type emitter on a first surface of the N-type substrate, and forming a tunnel layer and a doped conductive layer sequentially over a second surface of the N-type substrate in a direction away from the N-type substrate. The P-type emitter includes a first portion and a second portion, the first portion has first pyramid structures formed on a top surface of the first portion and the second portion has second pyramid structures formed on a top surface of the second portion. A transition surface is respectively formed on at least one edge of each first pyramid structure, the transition surface is joined with two adjacent inclined surfaces of the each first pyramid structure, and the transition surface is concave or convex relative to a center of the each first pyramid structure. A substructure is formed on each of top surfaces of at least a part of the first pyramid structures, and a shape of the substructure is spherical or spherical-like. Edges of each second pyramid structure are straight. A sheet resistance of the first portion ranges from 10 ohm/sq to 500 ohm/sq, a doping concentration at the top surface of the first portion ranges from $1E^{17}$ atoms/cm$^3$ to $8E^{19}$ atoms/cm$^3$. A sheet resistance of the second portion ranges from 100 ohm/sq to 1000 ohm/sq, and a doping concentration at the top surface of the second portion ranges from $1E^{16}$ atoms/cm$^3$ to $5E^{19}$ atoms/cm$^3$.

In an example, forming the P-type emitter includes: providing an N-type initial substrate; depositing a trivalent doping source on a top surface of the N-type initial substrate, where the trivalent doping source includes a trivalent element; treating, by using a process of external energy source treatment, a preset region of the top surface of the N-type initial substrate, to diffuse the trivalent doping source treated by the process of external energy source treatment into an interior of the N-type initial substrate; performing a high temperature treatment on the N-type initial substrate to form the P-type emitter in the interior of the N-type initial substrate, a top surface of the P-type emitter is exposed from the N-type initial substrate; forming the N-type substrate in a region of the N-type initial substrate excluding the P-type emitter; and forming the first portion of the P-type emitter in the preset region of the N-type initial substrate, and forming the second portion of the P-type emitter in a region of the P-type emitter excluding the preset region.

In an example, depositing the trivalent doping source on the top surface of the N-type initial substrate includes forming a first thin film layer including the trivalent doping source under a temperature ranged from 600° C. to 900° C., and a deposition time ranges from 20 s to 800 s; and performing the high temperature treatment on the N-type initial substrate includes introducing, for a duration ranged from 5 minutes to 300 minutes and under a temperature ranged from 800° C. to 1200° C., oxygen of a flow rate ranged from 500 sccm to 50000 sccm to form a second thin film layer, a thickness of the second thin film layer is greater than a thickness of the first thin film layer.

In an example, the production method further includes forming a first metal electrode being electrically connected to the first portion of the P-type emitter.

Some embodiments of the present disclosure provide a photovoltaic module, including: a cell string formed by connecting a plurality of solar cells as described in any one of the above embodiments; an encapsulation layer configured to cover a surface of the cell string; and a cover plate configured to cover a surface of the encapsulation layer facing away from the cell string.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations.

DETAILED DESCRIPTION OF THE EMBODIMENTS

Figure 1:
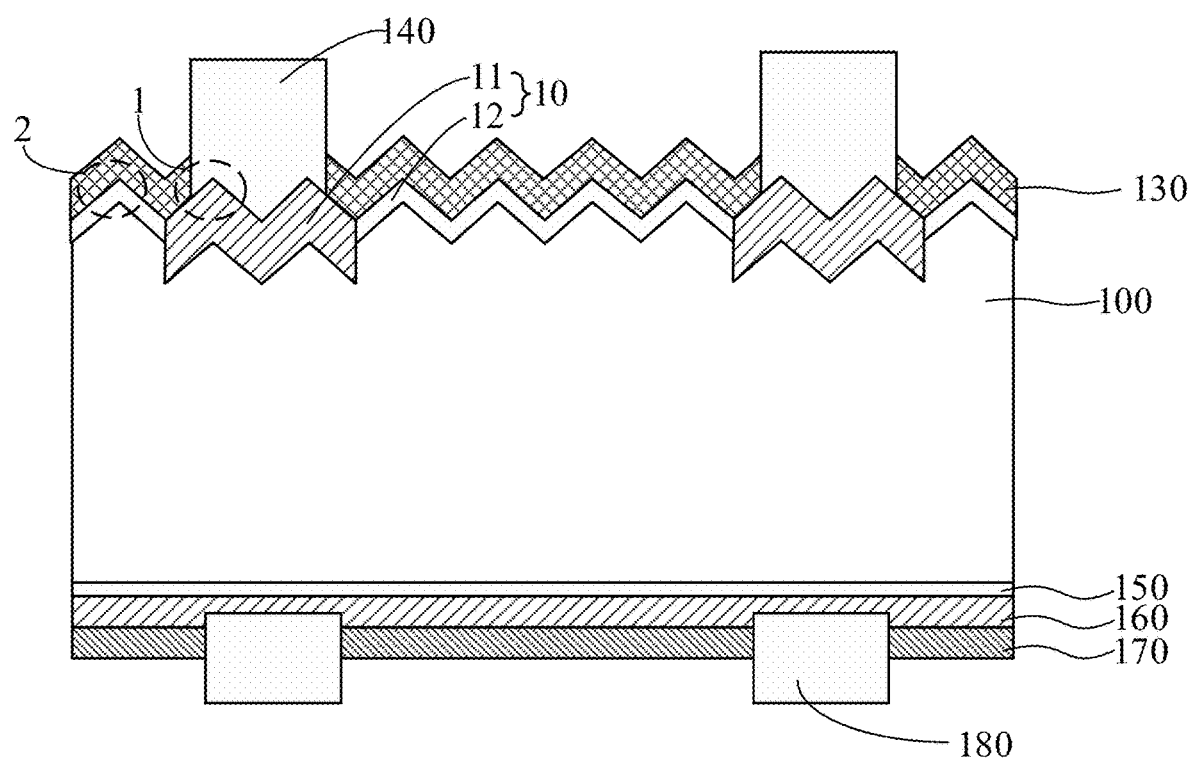
FIG. 1 is a structural schematic diagram of a solar cell according to an embodiment of the present disclosure.

It can be known from the background art that the existing solar cells have a poor photoelectric conversion performance.

By analysis, it is found that one of the reasons for the poor photoelectric conversion performance of the existing solar cells is that the emitter is usually electrically connected to a metal electrode, so that the metal electrode can collect carriers in the emitter. In order to reduce the contact resistance between the metal electrode and the emitter, the sheet resistance of the emitter should be reduced. At present, in order to reduce the sheet resistance of the emitter, the doping concentration of the emitter is usually increased. However, when the doping concentration of the emitter increases, the doping element in the emitter becomes too much, so that the doping element in the emitter becomes a strong recombination center, causing the increase of Auger recombination. Thus, the passivation performance of the emitter deteriorates, which in turn makes the photoelectric conversion performance of the solar cell to be poor.

Embodiments of the present disclosure provide a solar cell, including a P-type emitter formed on a first surface of an N-type substrate. A first portion has first pyramid structures formed on a top surface of the first portion of the P-type emitter. A transition surface is respectively formed on at least one edge of each first pyramid structure. The transition surface is joined with two adjacent inclined surfaces of the each first pyramid structure, and the transition surface is concave or convex relative to a center of the each first pyramid structure. A substructure is formed on each of top surfaces of at least a part of the first pyramid structures. In other words, each of at least a part of the first pyramid structures has a micro-defect. Such micro-defect can form a certain crystal change, thereby forming a defect energy level, so that the doping concentration of the first portion of the P-type emitter can be kept low while the sheet resistance of the first portion of the P-type emitter can be greatly reduced. In this way, the generation of Auger recombination can be reduced, and the photoelectric conversion performance of the solar cell can be improved. Moreover, edges of each second pyramid structure of the second portion of the P-type emitter are straight, in other words, each second pyramid structure is a normal pyramid structure. In this way, the sheet resistance of the second portion of the P-type emitter can be relatively high, thereby reducing the generation of recombination centers and improving the open-circuit voltage and short-circuit current of the solar cell.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be realized.

Figure 2:
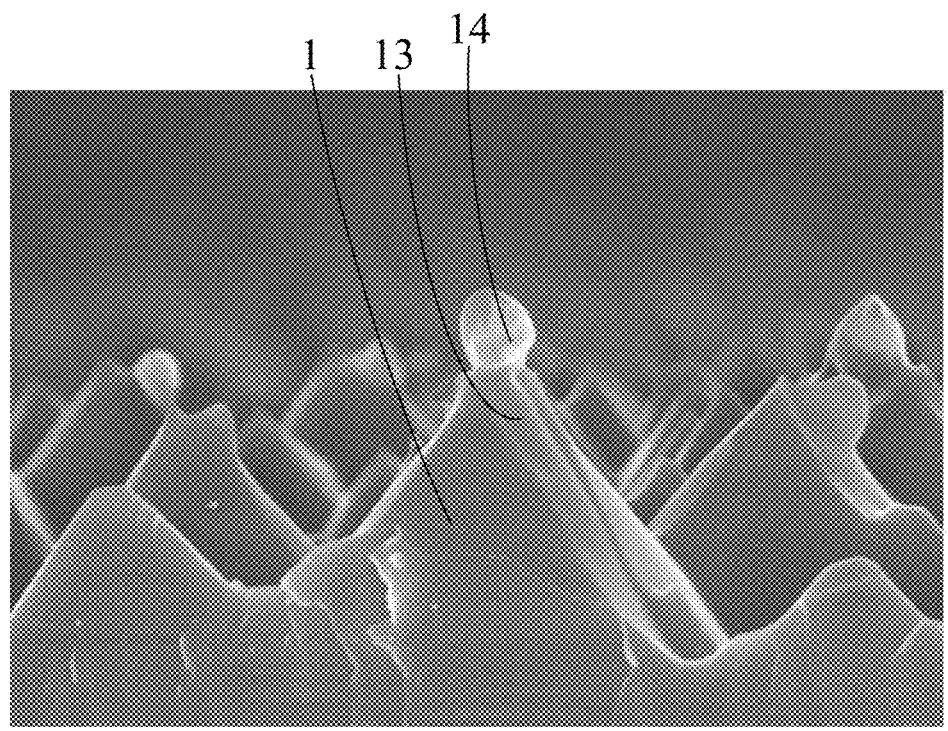
FIG. 2 is a partial enlarged view of the part marked with reference numeral "1" in FIG. 1.
Figure 3:
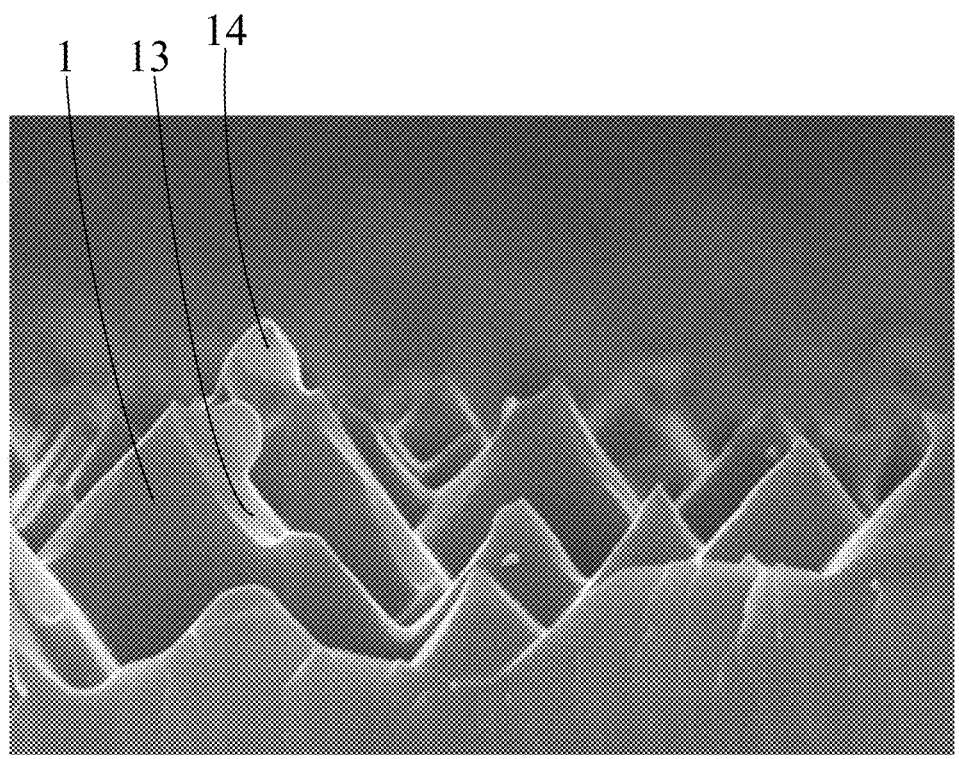
FIG. 3 is another partial enlarged view of the part marked with the reference numeral "1" in FIG. 1.
Figure 4:
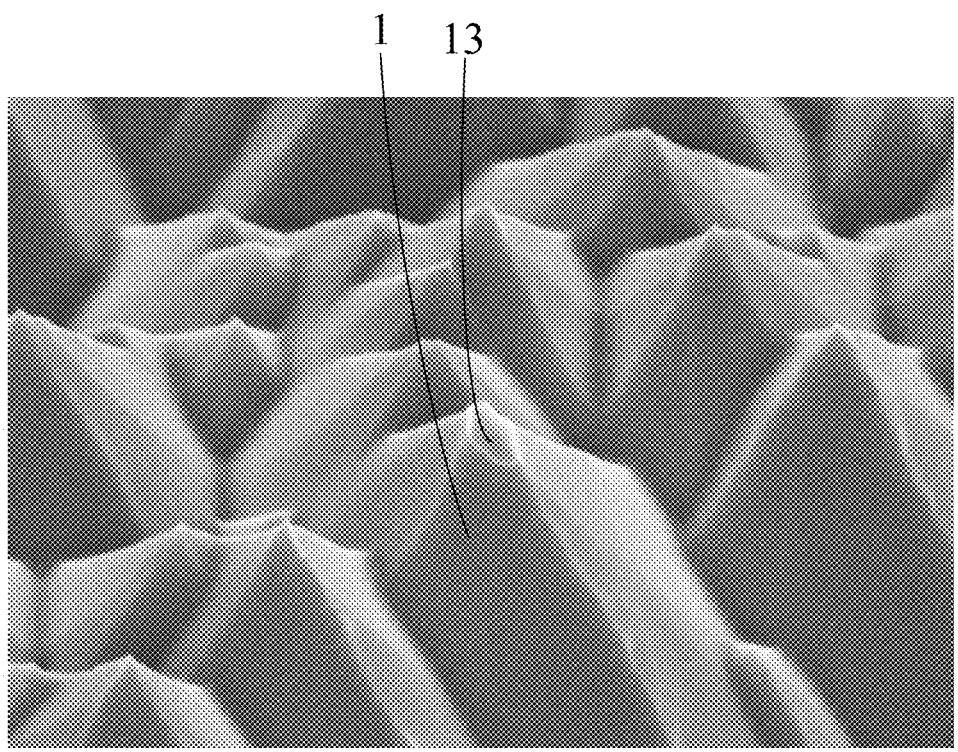
FIG. 4 is still another partial enlarged view of the part marked with the reference numeral "1" in FIG. 1.
Figure 5:
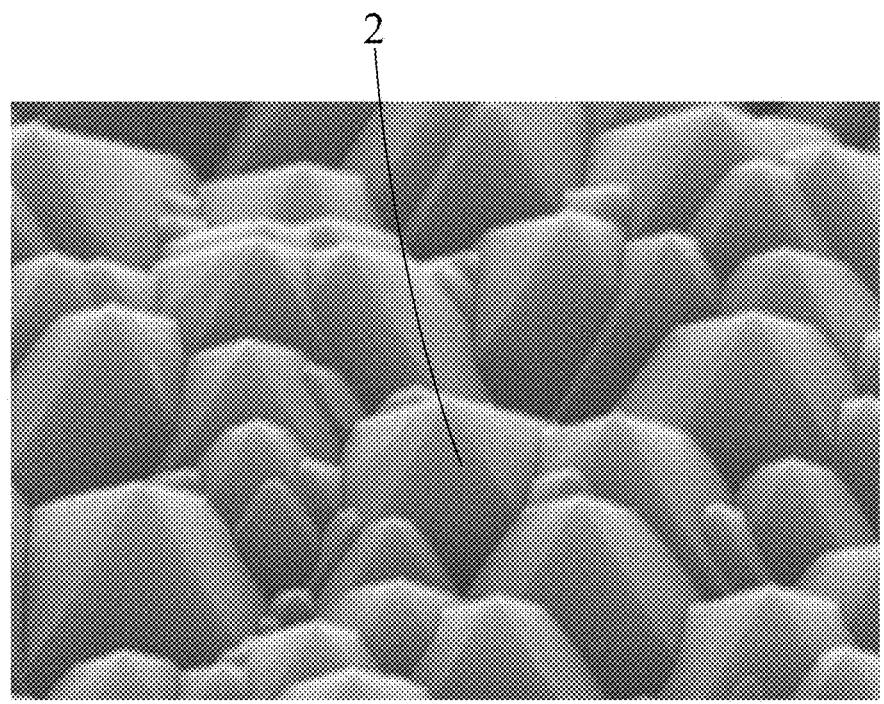
FIG. 5 is a partial enlarged view of the part marked with reference numeral "2" in FIG. 1.

FIG. 1 is a structural schematic diagram of a solar cell according to an embodiment of the present disclosure, FIG. 2 is a partial enlarged view of the part marked with reference numeral "1" in FIG. 1, FIG. 3 is another partial enlarged view of the part marked with the reference numeral "1" in FIG. 1, FIG. 4 is still another partial enlarged view of the part marked with the reference numeral "1" in FIG. 1, and FIG. 5 is a partial enlarged view of the part marked with reference numeral "2" in FIG. 1.

Referring to FIGS. 1 to 5, the solar cell includes: an N-type substrate 100, a P-type emitter 10 formed on a first surface of the N-type substrate 100, and a tunnel layer 150 and a doped conductive layer 160 sequentially formed over a second surface of the N-type substrate 100 in a direction away from the N-type substrate 100. The P-type emitter 10 includes a first portion 11 and a second portion 12, the first portion 11 has first pyramid structures 1 formed on a top surface of the first portion 11 and the second portion 12 has second pyramid structures 2 formed on a top surface of the second portion 12. A transition surface 13 is respectively formed on at least one edge of each first pyramid structure 1, the transition surface 13 is joined with two adjacent inclined surfaces of the each first pyramid structure 1, and the transition surface 13 is concave or convex relative to a center of the each first pyramid structure 1. A substructure 14 is formed on each of top surfaces of at least a part of the first pyramid structures 1, and a shape of the substructure 14 is spherical or spherical-like. Edges of each second pyramid structure 2 are straight. A sheet resistance of the first portion 11 ranges from ohm/sq to 500 ohm/sq, a doping concentration at the top surface of the first portion 11 ranges from $1E^{17}$ atoms/cm$^3$ to $8E^{19}$ atoms/cm$^3$. A sheet resistance of the second portion 12 ranges from 100 ohm/sq to 1000 ohm/sq, and a doping concentration at the top surface of the second portion 12 ranges from $1E^{16}$ atoms/cm$^3$ to $5E^{19}$ atoms/cm$^3$.

The N-type substrate 100 is used to receive incident light and generate photo-generated carriers. In some embodiments, the N-type substrate 100 may be an N-type silicon substrate 100, and the material of the N-type silicon substrate may include at least one of monocrystalline silicon, polycrystalline silicon, amorphous silicon or microcrystalline silicon. The N-type substrate 100 is an N-type semiconductor substrate 100, that is, the N-type substrate 100 is doped with N-type dopant ions, and the N-type dopant ions may be any one of phosphorus ions, arsenic ions, or antimony ions.

In some embodiments, the solar cell may be configured as a tunnel oxide passivated contact (TOPCON) cell. The first surface and the second surface of the N-type substrate 100 are arranged opposite to each other, and both the first surface and the second surface of the N-type substrate 100 can be used to receive incident light or reflected light. In some embodiments, the first surface may be the back surface of the N-type substrate 100, and the second surface may be the front surface of the N-type substrate 100. In some other embodiments, the first surface may be the front surface of the N-type substrate 100, and the second surface may be the back surface of the N-type substrate 100.

In some embodiments, the second surface of the N-type substrate 100 may be designed as a pyramid textured surface, so that the reflectivity of the second surface of the N-type substrate 100 to incident light is low, therefore the absorption and utilization rate of light is high. The first surface of the N-type substrate 100 may be designed as a non-pyramid textured surface, such as in a stacked step form, so that the tunnel oxide layer 110 located on the first surface of the N-type substrate 100 has high density and uniformity, therefore the tunnel oxide layer 110 has a good passivation effect on the first surface of the N-type substrate 100. In some embodiments, the first surface may be the back surface of the N-type substrate 100, and the second surface may be the front surface of the N-type substrate 100. In some other embodiments, the first surface may be the front surface of the N-type substrate 100, and the second surface may be the back surface of the N-type substrate 100.

Referring to FIGS. 2 to 4, the transition surface 13 is respectively formed on at least one edge of each first pyramid structure 1. It should be understood that an edge refers to a strip-like bulge portion of a first pyramid structure 1, i.e., a portion where adjacent inclined surfaces join of the first pyramid structure 1, and not only literally means "line". In an example, a first pyramid structure has a bottom surface and a plurality of inclined surfaces joined with the bottom surface, two adjacent inclined surfaces join with each other, and a transition surface 13 is formed between the two adjacent inclined surfaces, that is to say, at least parts of the two adjacent inclined surfaces join with each other via the transition surface 13. In some embodiments, a transition surface 13 is formed on one edge of a first pyramid structure 1, and the transition surface 13 may only be formed on a part of the edge, or may be formed on the entire edge. That is to say, two adjacent inclined surfaces of the first pyramid structure 1 are connected by the transition surface 13. In some other embodiments, a transition surface 13 is respectively formed on a plurality of edges of a first pyramid structure 1, and the transition surfaces 13 may only be formed on a part of an edge, or may be formed on the entire edge. The embodiments of the present disclosure do not limit the specific position of the transition surface 13 on an edge, as long as the transition surface 13 is formed on the edge.

It should be understood that the first pyramid structures 1 and the second pyramid structures 2 here are different from the textured structure. In the embodiments of the present disclosure, the silicon crystal morphology of the first portion 11 of the P-type emitter 10 is changed by forming the first pyramid structures 1 and the second pyramid structures 2 on the surface of the P-type emitter 10, thereby changing the performance of the first portion 11 of the P-type emitter 10.

As an example, a transition surface 13 is respectively formed on at least one edge of each first pyramid structure 1, i.e. the at least one edge of each first pyramid structure 1 has irregular deformation, and a spherical or spherical-like substructure 14 is formed on each of top surfaces of at least a part of the first pyramid structures 1, so that the first pyramid structures 1 have micro-defects, and changes in silicon crystals are formed in the first portion 11 of the P-type emitter. Furthermore, edges of each second pyramid structure 2 are straight, in other words, there is no deformation in the edges of each second pyramid structure 2. Due to the deformation in the at least one edge of each first pyramid structure 1 and the deformation in each of top surfaces of at least a part of the first pyramid structures 1, a sheet resistance of the first portion 11 ranges from 10 ohm/sq to 500 ohm/sq, and a doping concentration at the top surface of the first portion 11 ranges from $1E^{17}$ atoms/cm$^3$ to $8E^{19}$ atoms/cm$^3$. Since there is no deformation in the edges of each second pyramid structure 2, a sheet resistance of the second portion 12 ranges from 100 ohm/sq to 1000 ohm/sq, and a doping concentration at the top surface of the second portion 12 ranges from $1E^{16}$ atoms/cm$^3$ to $5E^{19}$ atoms/cm$^3$. It is obvious that the sheet resistance of the first portion 11 is much less than the sheet resistance of the second portion 12, but the doping concentration at the top surface of the first portion 11 is not much different from the doping concentration at the top surface of the second portion 12. It can be seen that due to the micro-defects of the first pyramid structures 1, the sheet resistance of the first portion 11 is much less than the sheet resistance of the second portion 12, thereby greatly improving ohmic contact of the first portion 11 of the P-type emitter 10. Meanwhile, the doping concentration of the first portion 11 of the P-type emitter 10 is kept low, so that the generations of recombination centers in the first portion 11 of the P-type emitter 10 can be reduced, the good passivation effect of the P-type emitter 10 can be maintained, and the generations of Auger recombination can be reduced. In this way, the photoelectric conversion performance of the solar cell can be improved. In some embodiments, heights of the first pyramid structures 1 range from 0.1 μm to 5 μm, and sizes of the bottoms of the first pyramid structures 1 range from 0.5 μm to 5 μm in any one dimension. It should be understood that the larger the heights and the sizes of the bottoms of the first pyramid structures 1 in the first portion 11 of the P-type emitter 10 in any one dimension are, the larger the overall sizes of the first pyramid structures 1 are, so that in a unit area, a number of the first pyramid structures 1 in the first portion 11 of the P-type emitter 10 is smaller. The smaller the number of the first pyramid structures 1, the fewer the first pyramid structures with micro-defects, so that degree of the crystal deformation generated in the first portion 11 of the P-type emitter 10 is lower. Correspondingly, the smaller the sizes of the first pyramid structures 1 is, the greater the number of the first pyramid structures 1 in the first portion 11 of the P-type emitter 10 per unit area, so that degree of the crystal deformation generated in the first portion 11 of the P-type emitter 10 is higher. Based on this, the heights of the first pyramid structures 1 are set in a range of 0.1 μm to 5 μm, and the sizes of the bottoms of the first pyramid structures 1 are set in a range of 0.5 μm to 5 μm in any one dimension. In this way, on one hand, the number of the first pyramid structures 1 is relatively great, and the degree of the crystal deformation generated in the first portion 11 of the P-type emitter 10 is relatively high, so that a relatively high defect energy level is obtained, thereby leading to a lower sheet resistance of the first portion 11 of the P-type emitter 10, and improving the ohmic contact. On the other hand, within this range, excessive number of the first pyramid structures 1 in the first portion 11 of the P-type emitter 10 can be avoided, which can prevent the problem of forming an excessively high defect energy level, thereby forming strong recombination centers in the P-type emitter 10. In this way, the passivation performance of the first portion 11 of the P-type emitter 10 can be improved.

Referring to FIGS. 2 and 3, a substructure 14 is further formed on each of at least a part of the first pyramid structures 1. The existence of the substructures 14 makes the degree of the micro-defects in the first pyramid structures 1 higher, so that the defect energy level formed in the first portion 11 of the P-type emitter is higher, thereby further reducing the sheet resistance of the first portion 11 of the P-type emitter 10.

Referring to FIGS. 1 and 5, the edges of each second pyramid structure 2 on the top surface of the second portion 12 are designed to be straight, in other words, in each second pyramid structure 2, two adjacent inclined surfaces are directly joined, and no deformation occurs on the edges, so that a second pyramid structure 2 is a regular tetrahedron structure. That is to say, in the second portion 12 of the P-type emitter 10, no change occurs in the crystal structure. Thus, no defect energy level is formed in the second portion 12 of the P-type emitter thereby not only leading to a relatively high sheet resistance of the second portion 12 of the P-type emitter 10, but also preventing the formation of a large number of recombination centers in the second portion 12 of the P-type emitter 10. In this way, a good passivation performance of the second portion 12 of the P-type emitter 10 can be maintained, the open-circuit voltage and short-circuit current of the solar cell can be relatively high, and photoelectric conversion performance of the solar cell can be improved.

Referring to FIG. 1, in some embodiments, based on the differences between the first pyramid structures 1 and the second pyramid structures 2, the sheet resistance of the first portion 11 may be lower than the sheet resistance of the second portion 12. Since the edge(s) of a first pyramid structure 1 deforms, and at least a part of the first pyramid structures 1 further include substructures 14, defect energy level is formed in the first portion 11 of the P-type emitter 10, so that the sheet resistance of the first portion 11 of the P-type emitter 10 is low. While, the edges of each second pyramid structure 2 does not deform, so that no defect energy level is formed in the second portion 12 of the P-type emitter 10. Thus, the second portion 12 of the P-type emitter 10 has a relatively high sheet resistance. In some embodiments, the sheet resistance of the first portion 11 may be 10 ohm/sq~50 ohm/sq, 50 ohm/sq~75 ohm/sq, 75 ohm/sq~100 ohm/sq, 100 ohm/sq~150 ohm/sq, 150 ohm/sq~200 ohm/sq, 200 ohm/sq~300 ohm/sq, 300 ohm/sq~400 ohm/sq or 400 ohm/sq~500 ohm/sq. The sheet resistance of the second portion 12 may be 100 ohm/sq~200 ohm/sq, 200 ohm/sq~300 ohm/sq, 300 ohm/sq~400 ohm/sq, 400 ohm/sq~500 ohm/sq, 500 ohm/sq~700 ohm/sq, 700 ohm/sq~850 ohm/sq, 850 ohm/sq~1000 ohm/sq. The sheet resistance of the first portion 11 of the P-type emitter 10 is much lower than that of the second portion 12, thus an improved ohmic contact of the first portion 11 of the P-type emitter 10 can be obtained, which can reduce the contact resistance between the first portion 11 of the P-type emitter 10 and the metal electrode when the metal electrode is arranged to be in an electrical contact with the first portion 11 of the P-type emitter 10, thereby improving the transport efficiency of carriers in the first portion 11 of the P-type emitter 10 and the second portion 12 of the P-type emitter 10. In addition, by setting the resistance of the second portion 12 of the P-type emitter 10 to 100 ohm/sq~1000 ohm/sq, the recombination of carriers in the second portion 12 of the P-type emitter 10 can be suppressed. In some embodiments, a recombination current in the second portion 12 of the P-type emitter 10 is below 20fA/cm², relatively low recombination current is conducive to reduction of recombination of carriers, thereby improving the passivation effect of the emitter. In this way, the open-circuit voltage, the short-circuit current and the photoelectric conversion efficiency of the solar cell can be improved.

In some embodiments, the junction depth of the first portion 11 is not less than that of the second portion 12, that is to say, a thickness of the first portion 11 is relatively large. Thus, an electrical connection can be provided between the metal electrode and the first portion 11 of the P-type emitter 10, so that the problem that the paste for forming the metal electrode penetrates the P-type emitter 10 and directly contacts with the N-type initial substrate 100 during the sintering of the paste can be prevented. In addition, the junction depth of the second portion 12 is designed to be shallower, that is, a thickness of the second portion 12 of the P-type emitter 10 is relatively small, so that the number of doping elements in the second portion 12 is less than the number of doping elements in the first portion 11. In other words, the doping concentration of the second portion 12 of the P-type emitter 10 is lower. Therefore, compared with the first portion 11 of the P-type emitter 10, the second portion 12 of the P-type emitter has a better passivation effect, which is conducive to reduction of the recombination of carriers and improvement of the open-circuit voltage and short-circuit current of the solar cell.

In some embodiments, a ratio of the junction depth of the first portion 11 to the junction depth of the second portion 12 is not less than 2. As an example, the ratio of the junction depth of the first portion 11 to the junction depth of the second portion 12 ranges from 2 to 5. For example, the ratio can be 2, 2.5, 3, 3.5, 4, 4.5 or 5. The junction depth of the first portion 11 is much deeper than that of the second portion 12, so that the junction depth of the first portion 11 of the P-type emitter 10 is deeper. In this way, when the metal electrode is electrically connected with the first portion 11 of the P-type emitter 10, it can be ensured that the paste will not burn through the first portion 11 of the p-type emitter 10 during the sintering, so as to prevent the problem of damaging the p-n junction due to the contact between the metal electrode and the N-type substrate 100, thereby ensuring good photoelectric conversion performance of the solar cell.

In some embodiments, the junction depth of the first portion 11 ranges from 0.2 μm to 10 μm, and the junction depth of the second portion 12 ranges from 0.05 μm to 5 μm. Within this range, the junction depth of the first portion 11 is not too deep, so as to avoid the problem that content of doping element in the first portion 11 of the P-type emitter 10 is too high due to excessive thickness of the first portion 11 to form a strong recombination center. Moreover, within this range, the junction depth of the second portion 12 is relatively shallow, and there are relatively few doping elements in the second portion 12 of the P-type emitter 10, so that a good passivation effect of the P-type emitter 10 can be maintained.

In some embodiments, a doping element in the first portion 11 of the P-type emitter 10 is of a same conductivity type as a doping element in the second portion 12 of the P-type emitter 10, and the doping element in the first portion 11 and the doping element in the second portion 12 are each a trivalent element. In other words, each of the first portion 11 of the P-type emitter 10 and the second portion 12 of the P-type emitter 10 includes only one of the trivalent elements, i.e. the first portion 11 and the second portion 12 are doped with a single element. Thus, the first portion 11 and the second portion 12 of the P-type emitter 10 include no impurity element, thereby preventing the problem of carrier recombination due to impurity elements becoming recombination centers.

In some embodiments, the doping element in the first portion 11 and the doping element in the second portion 12 each include boron element or gallium element. The first portion 11 and the second portion 12 are designed to include only one kind of doping element, so that the first portion 11 and the second portion 12 of the P-type emitter 10 become high-efficiency doping layers, thus there is no impurity element in the first portion 11 and the second portion 12 of the P-type emitter 10, or an amount of the impurity element is very small. In this way, the problem of the impurity element becoming a recombination center can be avoided, thereby suppressing the recombination of carriers and increasing the number of carriers.

In some embodiments, the doping concentration at the top surface of the first portion 11 is not less than the doping concentration at the top surface of the second portion 12 of the P-type emitter 10. Since the junction depth of the first portion 11 is larger than that of the second portion 12, the first portion 11 of the P-type emitter 10 includes more doping elements. In some embodiments, the doping concentration at the top surface of the first portion 11 may be $1E^{17}$ atoms/cm³ to $7E^{17}$ atoms/cm³, $7E^{17}$ atoms/cm³ to $1E^{18}$ atoms/cm³, $1E^{18}$ atoms/cm³ to $6E^{18}$ atoms/cm³, $6E^{18}$ atoms/cm³ to $1E^{19}$ atoms/cm³ or $1E^{19}$ atoms/cm³ to $8E^{19}$ atoms/cm³; and the doping concentration at the top surface of the second portion 12 may be $1E^{16}$ atoms/cm³ to $1E^{17}$ atoms/cm³, $1E^{17}$ atoms/cm³ to $1E^{18}$ atoms/cm³, $1E^{18}$ atoms/cm³ to $1E^{19}$ atoms/cm³ or $1E^{19}$ atoms/cm³ to $5E^{19}$ atoms/cm³. The doping concentration at the top surface of the first portion 11 is designed to be relatively high, which can ensure that the sheet resistance of the first portion 11 is relatively low. Meanwhile, the doping concentration at the top surface of the second portion 12 is designed to be relatively low, which can avoid that excessive doping elements become recombination centers due to there being too many doping elements in the second portion 12. In this way, the recombination of carriers can be suppressed and the short-circuit current and open-circuit voltage of the solar cell can be improved. It is can be seen that the doping concentration at the top surface of the first portion 11 is relatively close to the doping concentration at the top surface of the second portion 12. In some embodiments, the doping concentration at the top surface of the first portion 11 may be equal to the doping concentration at the top surface of the second portion 12. Thus, the doping concentration at the top surface of the first portion 11 is reduced, and the sheet resistance of the first portion 11 is much less than that of the second portion 12. In this way, both a relatively low sheet resistance of the first portion 11 and a relatively low doping concentration of the first portion 11 can be achieved, thereby improving the ohmic contact of the P-type emitter 10 and maintaining a good passivation effect of the P-type emitter 10.

In some embodiments, in a direction from the top surface of the P-type emitter 10 to the bottom surface of the P-type emitter 10, the doping concentration in the interior of the first portion 11 of the P-type emitter 10 gradually decreases, and the doping concentration in the interior of the second portion 12 of the P-type emitter 10 gradually decreases. That is to say, each of the first portion 11 of the P-type emitter 10 and the second portion 12 of the P-type emitter 10 has a descending doping concentration gradient, which is conducive to the transport of carriers in the first portion 11 of the P-type emitter 10 and the second portion 12 of the P-type emitter 10 from a region with a relatively high concentration to a region with a relatively low concentration, until into the N-type substrate 100. In this way, the transport speed of carriers can be increased and the open-circuit voltage of the solar cell can be improved.

In some embodiments, the difference between the doping concentration at the top surface of the first portion 11 and the doping concentration at the bottom surface of the first portion 11 is $8E^{19}$ atoms/cm$^3$ to $1E^{17}$ atoms/cm$^3$. Within this range, on one hand, the difference in doping concentration in the interior of the first portion 11 of the P-type emitter 10 is relatively high, thereby facilitating the transport of carriers. On the other hand, it can be prevented that the difference in doping concentration in the interior of the first portion 11 of the P-type emitter 10 is too small, thereby preventing an excessive overall doping concentration of the first portion 11 due to the small difference between the doping concentration at the top surface and the doping concentration in the first portion 11.

In some embodiments, the difference between the doping concentration at the top surface of the second portion 12 and the doping concentration at the bottom surface of the second portion 12 is $5E^{19}$ atoms/cm$^3$ to $1E^{16}$ atoms/cm$^3$. Within this range, the doping concentration in the interior of the second portion 12 of the P-type emitter 10 will not be too low, so that the normal transport of carriers in the second portion 12 of the P-type emitter 10 can be ensured. In addition, within this range, the overall doping concentration of the second portion 12 of the P-type emitter 10 can be kept low, thus Auger recombination can be prevented from occurring in the second portion 12 of the P-type emitter 10.

In some embodiments, at least a part of at least one inclined surface of the first pyramid structure 1 is concave or convex relative to a center of the first pyramid structure 1, that is to say, at least one inclined surface of the first pyramid structure 1 has irregular deformation. This irregular deformation leads to dislocations and dangling bonds in the first portion 11 of the P-type emitter 10, thereby forming a deep energy level in interior of the first portion 11 of the P-type emitter 10, thus further reducing the sheet resistance of the first portion 11 of the P-type emitter 10.

In some embodiments, the ratio of a width of the second portion 12 to a width of the first portion 11 is greater than 5.6. That is to say, the second portion 12 of the P-type emitter 10 with relatively higher sheet resistance accounts for a higher proportion, since the second portion 12 of the P-type emitter 10 has better passivation performance and can suppress the recombination of carriers, the overall passivation performance of the P-type emitter 10 is good. Furthermore, since the first portion 11 of the P-type emitter 10 only needs to be electrically connected to the metal electrode to improve the ohmic contact with the metal electrode, the width of the first portion 11 of the P-type emitter 10 can be set to be small, so as to improve the ohmic contact and maintain relatively good passivation performance of the emitter.

In some embodiments, the solar cell further includes a first metal electrode 140, the first metal electrode 140 is formed on the first surface of the N-type substrate 100 and is electrically connected to the first portion 11 of the P-type emitter 10. Since the carriers in the P-type emitter 10 will transport to the first metal electrode 140 electrically connected to the first portion 11 of the P-type emitter 10, and the sheet resistance of the first portion 11 of the P-type emitter 10 is relatively low, so that the contact resistance between the first portion 11 of the P-type emitter 10 and the first metal electrode 140 is low. In some embodiments, the metal recombination current in the first portion 11 of the P-type emitter 10 can be as high as 700 fA/cm$^2$, thereby increasing the transport rate of carriers in the P-type emitter 10 to the first metal electrode 140. In addition, since the first portion 11 of the P-type emitter 10 has a relatively deep junction depth, the conductive paste does not easily penetrate the first portion 11 of the P-type emitter 10 during the preparation of the first metal electrode 140. In this way, damage to the structure of the p-n junction can be avoided, which is conducive to maintenance of the good photoelectric conversion performance of the solar cell.

In some embodiments, a width of the first metal electrode 140 is less than or equal to the width of the first portion 11 of the P-type emitter 10, so that the first metal electrode 140 can be encapsulated by the first portion 11 of the P-type emitter 10, i.e. the side surfaces and the bottom surface of the first metal electrode 140 are in contact with the first portion 11 of the P-type emitter 10. Since the sheet resistance of the first portion 11 of the P-type emitter 10 is relatively lower, the contact resistance between the first metal electrode 140 and the P-type emitter 10 can be further improved by designing the first metal electrode 140 to be encapsulated by the first portion 11 of the P-type emitter 10, thereby improving the collection efficiency of carriers by the first metal electrode 140.

In some embodiments, the solar cell further includes an anti-reflection layer 130 located on the top surface of the P-type emitter 10, and the first metal electrode 140 penetrates the anti-reflection layer 130 to electrically connect to the P-type emitter 10. The anti-reflection layer 130 is used for reducing reflection of incident light by the substrate. In some embodiments, the anti-reflection layer 130 may be a single-layer structure or a multi-layer structure, and the material of the anti-reflection layer 130 may be at least one of magnesium fluoride, silicon oxide, aluminum oxide, silicon oxynitride, silicon nitride, and titanium oxide.

The tunnel layer 150 is used to achieve interface passivation of the second surface of the substrate. In some embodiments, the material of the tunnel layer 150 may be a dielectric material, such as any one of silicon oxide, magnesium fluoride, silicon oxide, amorphous silicon, polycrystalline silicon, silicon carbide, silicon nitride, silicon oxynitride, aluminum oxide and titanium oxide.

The doped conductive layer 160 is used to form field passivation. In some embodiments, the material of the doped conductive layer 160 may be doped silicon. In some embodiments, the doped conductive layer 160 and the substrate include doping elements of the same conductivity type. The doped silicon may include one or more of N-type doped polysilicon, N-type doped microcrystalline silicon and N-type doped amorphous silicon and silicon carbide.

In some embodiments, the solar cell further includes a first passivation layer 170 located on a surface of the doped conductive layer 160 away from the substrate. In some embodiments, the material of the first passivation layer 170 may be one or more of magnesium fluoride, silicon oxide, aluminum oxide, silicon oxynitride, silicon nitride and titanium oxide. In some embodiments, the first passivation layer 170 may be a single-layer structure. In some other embodiments, the first passivation layer 170 may be a multi-layer structure.

In some embodiments, the solar cell further includes a second metal electrode 180 penetrating the first passivation layer 170 to form an electrical connection with the doped conductive layer 160.

In the solar cell as described in the above embodiments, a P-type emitter 10 is formed on a first surface of an N-type substrate 100. A first portion 11 has first pyramid structures 1 formed on the first portion 11 of the P-type emitter 10. A transition surface 13 is respectively formed on at least one edge of each first pyramid structure 1. The transition surface 13 is joined with two adjacent inclined surfaces of the each first pyramid structure 1, and the transition surface 13 is concave or convex relative to a center of the each first pyramid structure 1. A substructure 14 is formed on each of top surfaces of at least a part of the first pyramid structures 1. In other words, each of at least a part of the first pyramid structures 1 has a micro-defect. Such micro-defect can form a certain crystal change, thereby forming a defect energy level, so that the doping concentration of the first portion 11 of the P-type emitter 10 can be kept low while the sheet resistance of the first portion 11 of the P-type emitter 10 can be greatly reduced. In this way, the generation of Auger recombination can be reduced, and the photoelectric conversion performance of the solar cell can be improved. Moreover, edges of each second pyramid structure 2 of the second portion 12 of the P-type emitter 10 are straight, in other words, a second pyramid structure is a normal pyramid structure. In this way, the sheet resistance of the second portion 12 of the P-type emitter 10 can be relatively high, thereby reducing the generation of recombination centers and improving the open-circuit voltage and short-circuit current of the solar cell.

Figure 6:
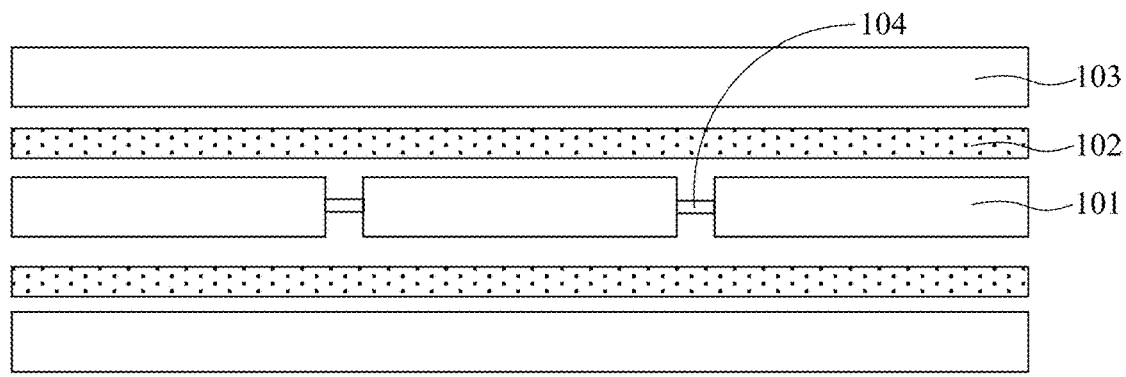
FIG. 6 is a structural schematic diagram of a photovoltaic module according to an embodiment of the present disclosure.

Embodiments of the present disclosure further provide a photovoltaic module, referring to FIG. 6, the photovoltaic module includes: a cell string formed by connecting a plurality of solar cells 101 as provided in the above embodiments; an encapsulation layer 102 used for covering a surface of the cell string; and a cover plate 103 used for covering a surface of the encapsulation layer 102 facing away from the cell string. The solar cells 101 are electrically connected in a form of a single piece or multiple pieces to form a plurality of cell strings, and the plurality of cell strings are electrically connected in series and/or parallel.

In some embodiments, the plurality of cell strings may be electrically connected by conductive strips 104. The encapsulation layer 102 covers the front and back surfaces of the solar cell 101. As an example, the encapsulation layer 102 may be an organic encapsulation adhesive film, such as an adhesive film of ethylene-vinyl acetate copolymer (EVA), an adhesive film of polyethylene octene co-elastomer (POE) or an adhesive film of polyethylene terephthalate (PET) and the like. In some embodiments, the cover plate 103 may be a cover plate 103 with a light-transmitting function, such as a glass cover plate, a plastic cover plate, or the like. As an example, the surface of the cover plate 103 facing the encapsulation layer 102 may be a concave-convex surface, thereby increasing the utilization rate of incident light.

Another embodiment of the present disclosure further provides a production method for a solar cell, the solar cell as provided in the above embodiments can be obtained by implementing the method. The production method provided by this embodiment of the present disclosure will be described in detail below with reference to the accompanying drawings.

FIGS. 7 to 13 are structural schematic diagrams corresponding to the operations of the production method for the solar cell provided by this embodiment of the present disclosure.

An N-type substrate 100 is provided.

The N-type substrate 100 is used to receive incident light and generate photo-generated carriers. In some embodiments, the N-type substrate 100 may be an N-type silicon substrate, and the material of the N-type silicon substrate may include at least one of monocrystalline silicon, polycrystalline silicon, amorphous silicon or microcrystalline silicon. The N-type substrate 100 is an N-type semiconductor substrate, that is, the N-type substrate 100 is doped with N-type dopant ions, and the N-type dopant ions may be any one of phosphorus ions, arsenic ions, or antimony ions.

Referring to FIGS. 7 to 11, a P-type emitter 10 is formed on a first surface of the N-type substrate 100, the P-type emitter 10 includes a first portion 11 and a second portion 12, first pyramid structures 1 are formed on a top surface of the first portion 11, a transition surface 13 is respectively formed on at least one edge of each first pyramid structure 1, the transition surface 13 is joined with two adjacent inclined surfaces of the each first pyramid structure 1, and the transition surface 13 is concave or convex relative to a center of the each first pyramid structure 1. A substructure 14 is formed on each of top surfaces of at least a part of the first pyramid structures 1, and a shape of the substructure 14 is spherical or spherical-like. Second pyramid structures 2 are formed on a top surface of the second portion 12, edges of each second pyramid structure 2 are straight. A sheet resistance of the first portion 11 ranges from 10 ohm/sq to 500 ohm/sq, a doping concentration at the top surface of the first portion 11 ranges from $1E^{17}$ atoms/cm$^3$ to $8E^{19}$ atoms/cm$^3$, a sheet resistance of the second portion 12 ranges from 100 ohm/sq to 1000 ohm/sq, and a doping concentration at the top surface of the second portion 12 ranges from $1E^{16}$ atoms/cm$^3$ to $5E^{19}$ atoms/cm$^3$.

A transition surface 13 is respectively formed on at least one edge of each formed first pyramid structure 1, i.e. the at least one edge of each first pyramid structure 1 has irregular deformation, and a spherical or spherical-like substructure 14 is formed on each of top surfaces of at least a part of the first pyramid structures 1, so that the first pyramid structures 1 have micro-defects, and changes in silicon crystals are formed in the first portion 11 of the P-type emitter. Furthermore, edges of each second pyramid structure 2 are straight, in other words, there is no deformation in the edges of each second pyramid structure 2. Due to the deformation in the at least one edge of each first pyramid structure 1 and the deformation in each of top surfaces of at least a part of the first pyramid structures 1, a sheet resistance of the first portion 11 ranges from 10 ohm/sq to 500 ohm/sq, and a doping concentration at the top surface of the first portion 11 ranges from $1E^{17}$ atoms/cm$^3$ to $8E^{19}$ atoms/cm$^3$. Since there is no deformation in the edges of each second pyramid structure 2, a sheet resistance of the second portion 12 ranges from 100 ohm/sq to 1000 ohm/sq, and a doping concentration at the top surface of the second portion 12 ranges from $1E^{16}$ atoms/cm$^3$ to $5E^{19}$ atoms/cm$^3$. It is obvious that the sheet resistance of the first portion 11 is much less than the sheet resistance of the second portion 12, but the doping concentration at the top surface of the first portion 11 is not much different from the doping concentration at the top surface of the second portion 12. It can be seen that due to the micro-defects of the first pyramid structures 1, the sheet resistance of the first portion 11 is much less than the sheet resistance of the second portion 12, thereby greatly improving ohmic contact of the first portion 11 of the P-type emitter 10. Meanwhile, the doping concentration of the first portion 11 of the P-type emitter 10 is kept low, so that the generations of recombination centers in the first portion 11 of the P-type emitter 10 can be reduced, the good passivation effect of the P-type emitter 10 can be maintained, and the generations of Auger recombination can be reduced. In this way, the photoelectric conversion performance of the solar cell can be improved.

In some embodiments, a method for forming the P-type emitter 10 includes the following operations.

Figure 7:
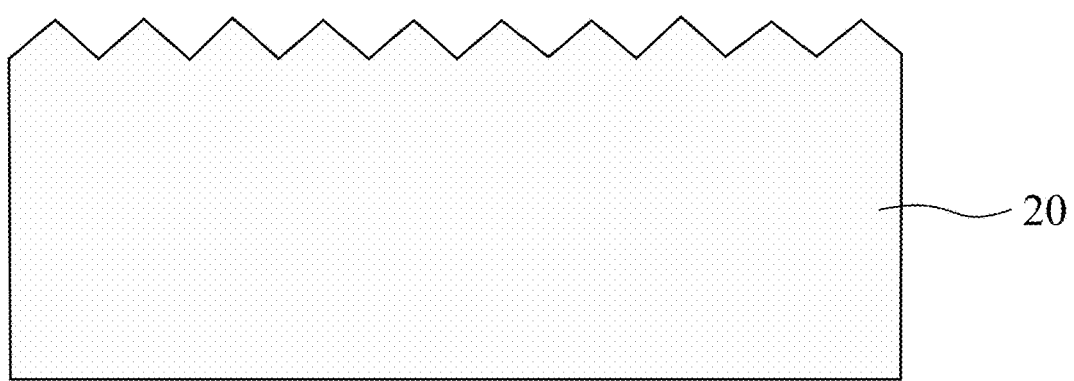
FIG. 7 is a structural schematic diagram corresponding to the operation of providing an N-type initial substrate in a production method for a solar cell according to an embodiment of the present disclosure.

Referring to FIG. 7, an N-type initial substrate 20 is provided, and the N-type initial substrate 20 is used as a basis for forming the N-type substrate 100 and the P-type emitter Therefore, the materials of the N-type initial substrate 20 and the N-type substrate 100 may be of the same.

In some embodiments, a first surface of the N-type initial substrate 20 may be designed as a pyramid textured surface, so that the reflectivity of a first surface of the N-type initial substrate 20 to incident light is low, and the absorption and utilization rate of light is high. In some embodiments, the N-type initial substrate 20 is an N-type initial semiconductor substrate, that is, the N-type initial substrate 20 is doped with N-type dopant ions, and the N-type dopant ions may be any one of phosphorus ions, arsenic ions, or antimony ions.

Figure 8:
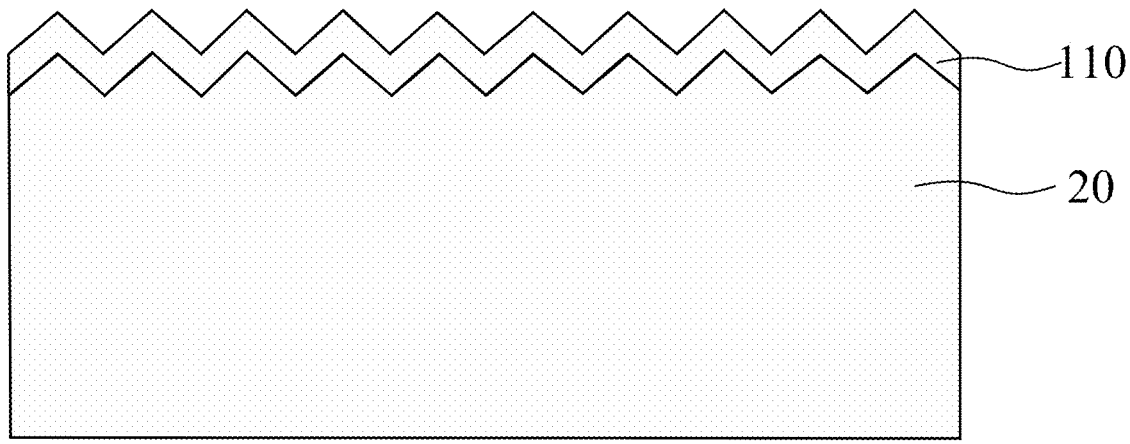
FIG. 8 is a structural schematic diagram corresponding to the operation of forming a first thin film layer in the production method according to an embodiment of the present disclosure.
Figure 9:
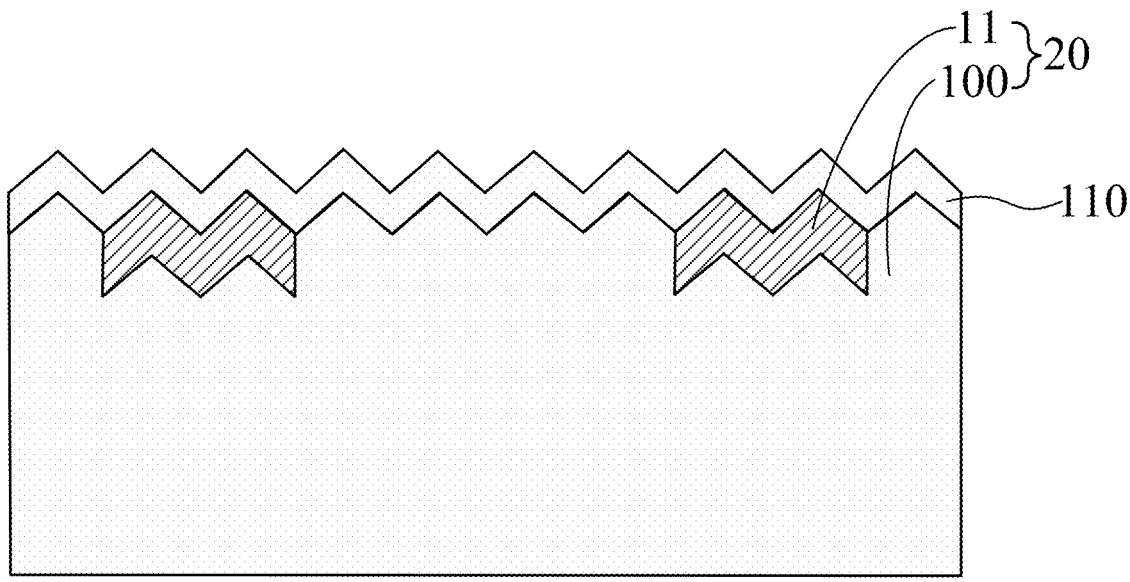
FIG. 9 is a structural schematic diagram corresponding to the operation of forming a first portion of the P-type emitter in the production method according to an embodiment of the present disclosure.

The method for forming the P-type emitter 10 further includes, referring to FIGS. 8 and 9, depositing a trivalent doping source on a top surface of the N-type initial substrate 20. The trivalent doping source includes a trivalent element. The trivalent doping source located on the top surface of the N-type initial substrate 20 is used to be subsequently diffused into the N-type initial substrate 20 to form the P-type emitter 10. The trivalent doping source is designed to include a trivalent element, i.e. the N-type initial substrate 20 is doped with a single element, so that the formed P-type emitter 10 includes an element of a single type, and therefore becomes a high-efficiency doping layer. It is designed that there is no impurity element in the first portion 11 of the P-type emitter 10 and the second portion 12 of the P-type emitter 10, or an amount of the impurity element is very small. In this way, the problem that recombination of carriers occurs due to the impurity element becoming a recombination center can be avoided. In some embodiments, the trivalent doping source may be a boron source, and may for example be boron trichloride or boron tribromide.

Referring to FIG. 8, in some embodiments, depositing the trivalent doping source on the top surface of the N-type initial substrate 20 includes forming a first thin film layer 110. The first thin film layer 110 includes the trivalent dopant source and at least one of boron element, oxygen element, silicon element or chlorine element. A deposition time ranges from 20 s to 800 s, and a temperature ranges from 600° C. to 900° C. In some embodiments, when the trivalent doping source is a boron source, the main components of the first thin film layer 110 may include silicon oxide and boron oxide, and the trivalent doping source may be stored in the first thin film layer 110 in a form of boron oxide. Since silicon oxide has high hardness, it can protect the N-type initial substrate 20 during the doping process.

In addition, since the thickness of the first thin film layer 110 is relatively small, when a relatively thin first thin film layer 110 includes relatively many trivalent doping sources, the trivalent doping sources aggregates in the first thin film layer 110, thereby increasing the concentration of the trivalent doping source. In this way, when the trivalent doping source is subsequently diffused into the N-type initial substrate 20 by the doping process, the doping process is facilitated and it is easier to form the first portion 11 of the P-type emitter 10 with relatively high doping concentration, thereby reducing the sheet resistance of the first portion 11 of the P-type emitter 10. In addition, since the thickness of the first thin film layer 110 is relatively small, the trivalent doping source that can be included in the first thin film layer 110 will not be too much, so that excessive trivalent doping source elements can prevented from being doped into the N-type initial substrate 20. In this way, the problem that relatively many trivalent doping source elements become strong recombination centers due to too many trivalent doping source elements being contained in the N-type initial substrate 20, which leads to poor passivation capability of the formed first portion 11 of the P-type emitter 10 can be prevented.

In some embodiments, a method for forming the first thin film layer 110 may include depositing a trivalent doping source on the first surface of the N-type initial substrate 20. In some embodiments, boron trichloride may be deposited, as the trivalent doping source, on the first surface of the N-type initial substrate 20 by chemical vapor deposition or spin coating.

As an example, the method for forming the first thin film layer 110 may include: performing a boat feeding process on the N-type initial substrate 20; after the boat feeding process of the N-type initial substrate 20, raising a temperature to a first preset temperature, and depositing a trivalent doping source on the first surface of the N-type initial substrate 20, the first preset temperature may be 500° C. to 900° C.; then raising the temperature to a second preset temperature, the second preset temperature is greater than the first preset temperature, for example, the second preset temperature may be 900° C. to 1300° C.; and performing a junction pushing process in a nitrogen atmosphere, which can improve the density and uniformity of the formed first thin film layer 110. In some embodiments, while depositing the trivalent doping source, a small amount of oxygen may be introduced, for example, 100 sccm to 2000 sccm, which is conducive to the further formation of a first thin film layer 110 with relatively high density.

Referring to FIG. 9, after depositing the trivalent dopant source, a preset region of the top surface of the N-type initial substrate 20 is treated using a process of external energy source treatment, and the trivalent dopant source treated by the process of external energy source treatment is diffused into an interior of the N-type initial substrate 20 to form the first portion 11 of the P-type emitter 10 in the preset region of the N-type initial substrate 20, and a top surface of the first portion 11 of the P-type emitter 10 is exposed from the N-type initial substrate 20. The process of external energy source treatment is performed on the preset region, so that the trivalent doping source in the preset region of the first thin film layer 110 is diffused into the interior of the N-type initial substrate 20. At the same time, with the process of external energy source treatment, the structure of the preset region at the top surface of the N-type initial substrate 20 is changed to form the first pyramid structures 1. It is noted that the structure of the N-type initial substrate 20 is a regular tetrahedral structure before performing the process of external energy source treatment. After the process of external energy source treatment, at least one edge of each first pyramid structure 1 deforms to form a transition surface 13, and a substructure is formed on each of top surfaces of at least a part of the first pyramid structures. After the preset region of the N-type initial substrate 20 is doped with the trivalent doping source, the top surface of the formed first portion 11 of the P-type emitter 10 has the first pyramid structures 1. In this way, a deep energy level can be formed in the first portion 11 of the P-type emitter 10, thus the sheet resistance of the first portion 11 of the P-type emitter 10 can be reduced.

In some embodiments, the process of external energy source treatment includes a laser doping process. In the laser doping process, a wavelength of the laser ranges from 300 nm to 1000 nm, for example, 300 nm to 500 nm, 500 nm to 750 nm, 750 nm to 900 nm, or 900 nm to 1000 nm. By controlling a focal position and laser wavelength of the laser parameters, structural morphologies at different positions of the first pyramid structures 1 can be changed. In addition, due to the simple operation of the laser process, the laser parameters are easy to control, so that the morphologies of the formed first pyramid structures 1 is as expected. By setting the wavelength and energy density of the laser within this range, deformation occurs on at least one edge of each first pyramid structure 1, and a spherical or spherical-like substructure 14 is formed on each of top surfaces of at least a part of the first pyramid structures 1. Due to the microdefects of the formed first pyramid structures 1, crystal changes are formed in the first portion 11 of the P-type emitter 10, thereby forming a defect energy level, so that the doping concentration of the first portion 11 of the P-type emitter 10 can be kept low while the sheet resistance of the first portion 11 can be greatly reduced. In this way, not only the ohmic contact can be greatly improved, but also a good passivation effect of the first portion 11 of the P-type emitter 10 can be maintained, and the short-circuit voltage and open-circuit current of the solar cell can be improved.

In another embodiment, the process of external energy source treatment may also include plasma irradiation or a directional ion implantation process.

In some embodiments, after forming the first portion 11 of the P-type emitter 10, the method further includes: performing a cleaning operation on the first surface of the N-type initial substrate 20 to remove the first thin film layer 110. In this way, the remaining trivalent doping sources in the first thin film layer 110 and the adsorbed impurities on the surface of the N-type initial substrate 20 can be removed, which is conducive to prevention of leakage. Furthermore, the first thin film layer 110 contains a large number of trivalent doping sources, and these trivalent doping sources will be converted into non-activated trivalent doping sources, such as non-activated boron, in the subsequent high temperature process for forming the second thin film layer. The existence of the non-activated trivalent doping sources will increase the recombination of carriers on the surface of the N-type initial substrate 20, thereby affecting the photoelectric conversion efficiency of the solar cell. Therefore, removing the first thin film layer 110 before the operation of forming the second thin film layer can also reduce the content of the non-activated trivalent doping sources on the surface of the N-type initial substrate 20 after subsequently forming the second thin film layer, thereby reducing the recombination of carriers on the surface of the N-type initial substrate 20 and improving the photoelectric conversion efficiency of the solar cell. As an example, the cleaning operation may include cleaning the surface of the N-type initial substrate 20 with alkali solution or acid solution, where the alkali solution may be at least one of KOH or $H_2O_2$ aqueous solution, and the acid solution may be at least one of HF or HCl aqueous solution.

Figure 10:
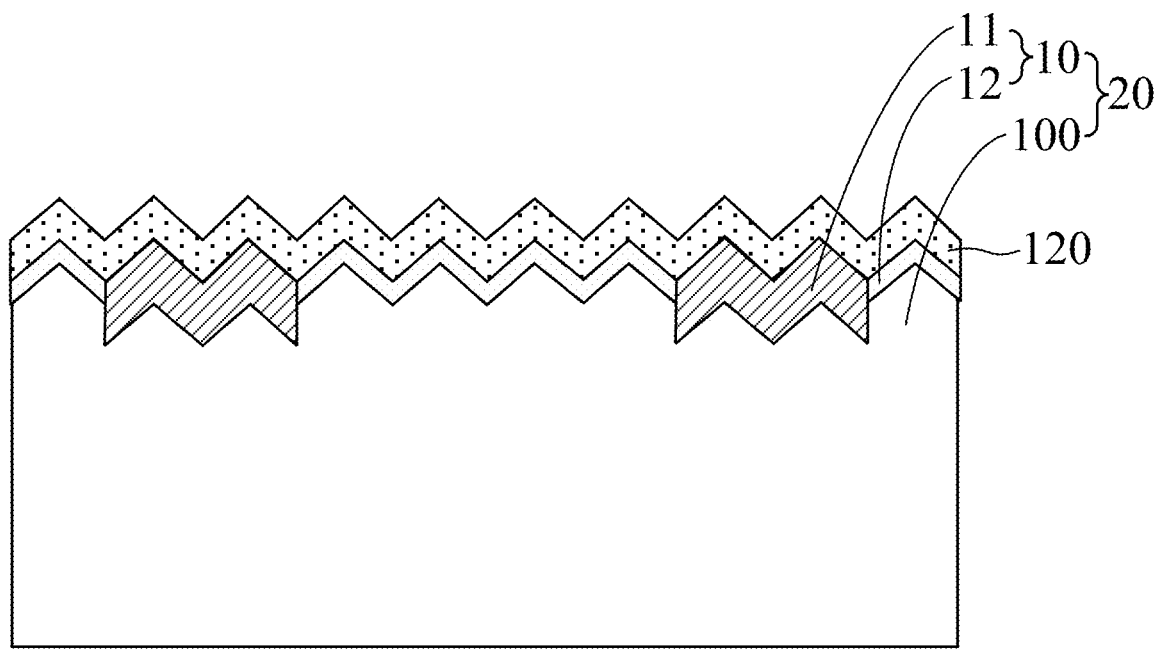
FIG. 10 is a structural schematic diagram corresponding to the operation of forming a second thin film layer in the production method according to an embodiment of the present disclosure.
Figure 11:
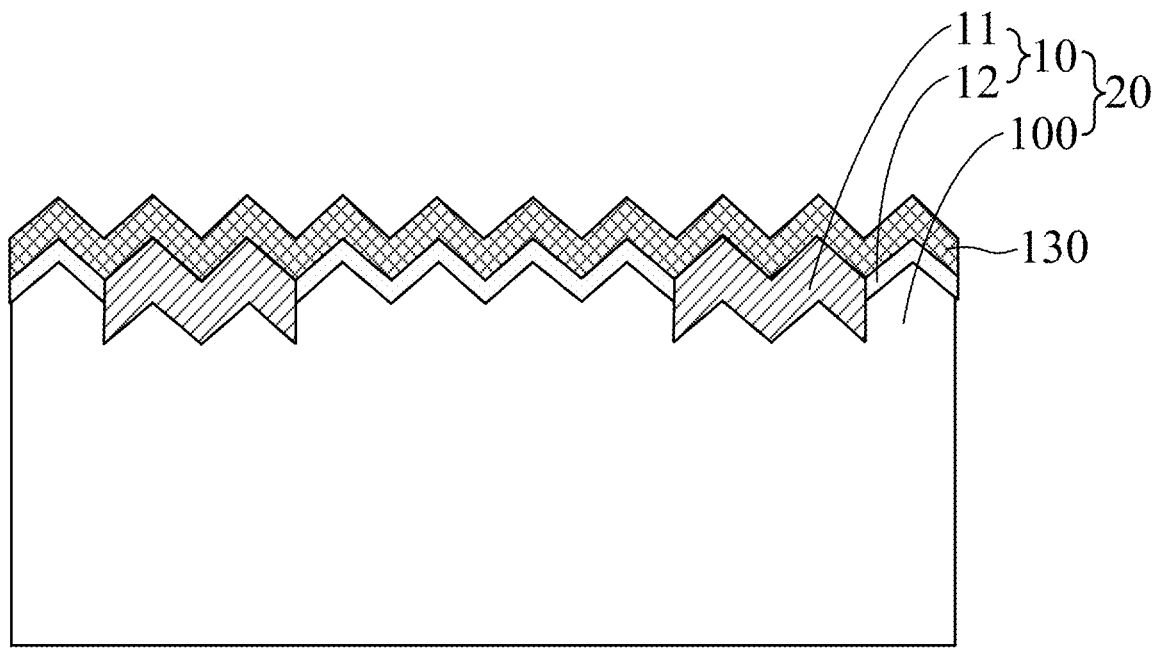
FIG. 11 is a structural schematic diagram corresponding to the operation of forming an anti-reflection layer in the production method according to an embodiment of the present disclosure.

After forming the first portion 11 of the P-type emitter 10, referring to FIGS. 10 to 11, a high temperature treatment is performed on the N-type initial substrate 20 to form the P-type emitter 10 in the N-type initial substrate 20, and the top surface of the P-type emitter 10 is exposed from the N-type initial substrate 20. As an example, the N-type substrate 100 is formed in a region of the N-type initial substrate 20 excluding the P-type emitter 10, and the second portion 12 of the P-type emitter 10 is formed in a region of the P-type emitter 10 excluding the preset region. Since the process of external energy source treatment is only performed on the surface of the preset region of the N-type initial substrate 20, the trivalent doping sources in the first thin film layer 110 corresponding to the preset region are diffused into the interior of the N-type initial substrate 20. Thus, the junction depth of the formed first portion 11 of the P-type emitter 10 is greater than the junction depth of the second portion 12 of the P-type emitter 10. Thus, the metal electrode can be arranged to be in electrical connection with the first portion 11 of the P-type emitter 10. In this way, the problem that the paste for forming the metal electrode penetrates the P-type emitter 10 and directly contacts with the N-type initial substrate 20 during the sintering process can be prevented. Moreover, the junction depth of the second portion 12 is designed to be shallow, that is, the thickness of the second portion 12 of the P-type emitter 10 is small, so that the number of doping elements in the second portion 12 is less than the number of doping elements in the first portion 11, that is, the doping concentration of the second portion 12 of the P-type emitter 10 is lower. Therefore, compared with the first portion 11 of the P-type emitter 10, the second portion 12 of the P-type emitter has a better passivation effect, which is conducive to reduction of the recombination of carriers and to improvement of the open-circuit voltage and short-circuit current of the solar cell.

After performing the high temperature treatment on the N-type initial substrate part of the trivalent doping sources is doped into the N-type initial substrate 20, so that part of the N-type initial substrate 20 is transformed into the second portion 12 of the P-type emitter 10. That is to say, the portion of the N-type initial substrate 20 excluding the first portion 11 of the P-type emitter 10 and the second portion 12 of the P-type emitter 10 corresponds to the N-type substrate 100.

Referring to FIG. 10, in some embodiments, in the operation of performing the high temperature treatment on the N-type initial substrate 20, oxygen of a flow rate of 500 sccm to 50000 sccm is introduced for a duration ranged from 5 mins to 300 mins and under a temperature ranged from 800° C. to 1200° C., to form a second thin film layer 120. A thickness of the second thin film layer 120 is smaller than a thickness of the first thin film layer 110. The amount of the oxygen introduced in the process of forming the second thin film layer 120 is relatively large, so that the oxygen can react with more trivalent doping sources, thus the thickness of the formed second thin film layer 120 is larger than the thickness of the first thin film layer 110. In this way, on one hand, when the thinner first thin film layer 110 includes more trivalent doping sources, the trivalent doping sources aggregate in the first thin film layer 110, thereby increasing the concentration of the trivalent doping sources, which is conducive to the laser doping, and because the first thin film layer 110 is relatively thin, it is easy for the laser to penetrate into the N-type initial substrate 20. On the other hand, the second thin film layer 120 is thicker, which can ensure that the amount of trivalent doping sources absorbed by the second thin film layer 120 in a region excluding the preset region of the first surface of the N-type initial substrate 20 is relatively large. In this way, the doping concentration at the top surface of the first portion 11 of the P-type emitter 10 and the doping concentration at the top surface of the second portion 12 of the P-type emitter 10 can be reduced, and the passivation performance can be improved.

Referring to FIG. 11, in some embodiments, the method further includes: performing the cleaning operation on the N-type initial substrate 20 to remove the second thin film layer 120; forming an anti-reflection layer 130 on the first surface of the N-type initial substrate 20, and the anti-reflection layer 130 is located on the top surface of the P-type emitter 10. In some embodiments, the anti-reflection layer 130 may be a single-layer structure or a multi-layer structure, and the material of the anti-reflection layer 130 may be at least one of magnesium fluoride, silicon oxide, aluminum oxide, silicon oxynitride, silicon nitride or titanium oxide. In some embodiments, the anti-reflection layer 130 may be formed by a plasma enhanced chemical vapor deposition (PECVD) method.

Figure 12:
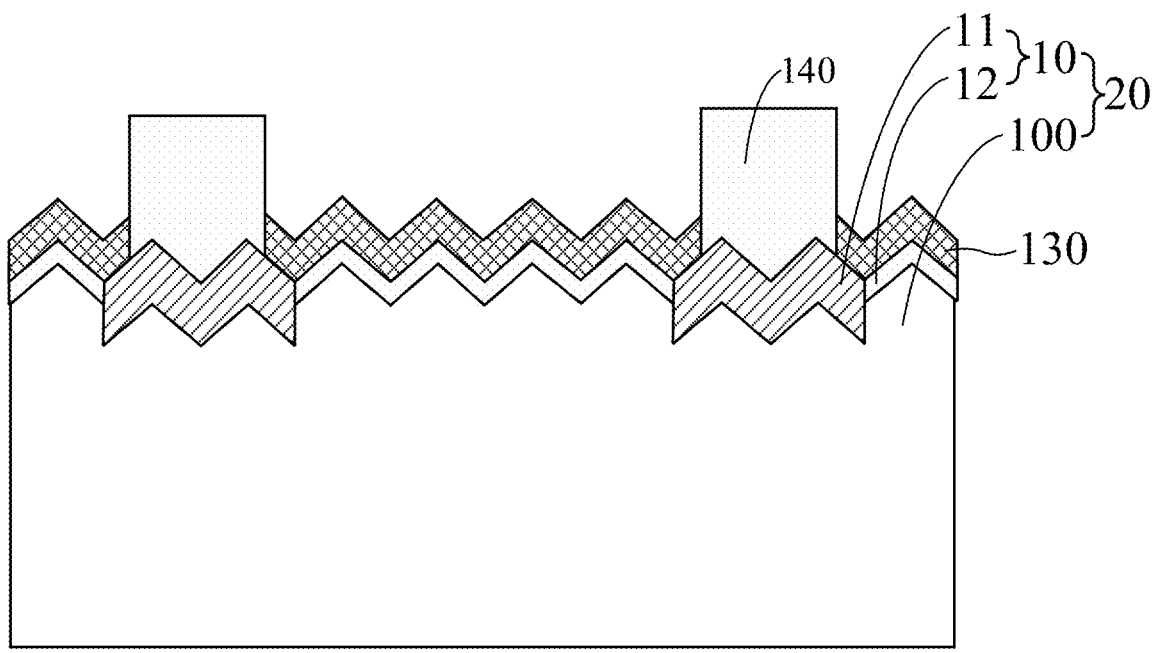
FIG. 12 is a structural schematic diagram corresponding to the operation of forming a first metal electrode in the production method according to an embodiment of the present disclosure.

Referring to FIG. 12, in some embodiments, the method further includes: forming a first metal electrode 140 being electrically connected to the first portion 11 of the P-type emitter 10. The first metal electrode 140 is located on the first surface of the N-type initial substrate 20. Since the sheet resistance of the first portion 11 of the P-type emitter 10 is low, the first metal electrode 140 is arranged to be electrically connected to the first portion 11 of the P-type emitter 10. In this way, the contact resistance between the first metal electrode 140 and the first portion 11 of the P-type emitter 10 can be reduced, thereby facilitating the transport of carriers in the first metal electrode 140 penetrating the anti-reflection layer 130. This because the carriers in the first portion 11 of the P-type emitter 10 and the second portion 12 of the P-type emitter 10 will transport to and be collected by the first metal electrode 140 in contact with the first portion 11 of the P-type emitter 10. That is to say, the electrons in the first portion 11 and the second portion 12 are desired to transport to the first metal electrode 140 in contact with the first portion 11 of the P-type emitter 10. Therefore, the transport of carrier can be greatly improved by the improvement of the contact resistance between the first metal electrode 140 and the first portion 11 of the P-type emitter 10.

In some embodiments, a method for forming the first metal electrode 140 includes: printing conductive paste on a top surface of the anti-reflection layer 130 in the preset region, the conductive material in the conductive paste may be at least one of silver, aluminum, copper, tin, gold, lead or nickel; and sintering the conductive paste, for example, the sintering may be performed under a peak temperature of 750° C. to 850° C., so as to penetrate the anti-reflection layer 130 to form the first metal electrode 140.

Figure 13:
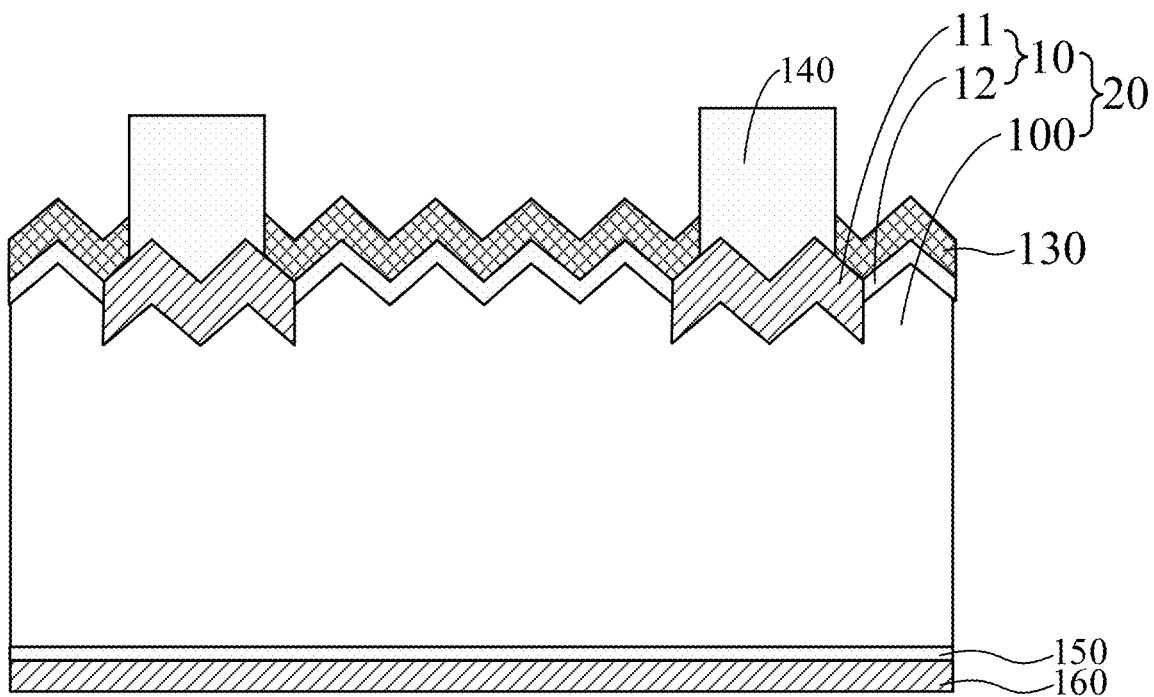
FIG. 13 is a structural schematic diagram corresponding to the operation of forming a tunnel layer and a doped conductive layer in the production method according to an embodiment of the present disclosure.

Referring to FIG. 13, a tunnel layer 150 and a doped conductive layer 160 are formed over a second surface of the N-type substrate 100 in a direction away from the N-type substrate 100.

The tunnel layer 150 is used to realize the interface passivation of the second surface of the N-type substrate 100. In some embodiments, the tunnel layer 150 may be formed using a deposition process, such as a chemical vapor deposition process. In some other embodiments, the tunnel layer 150 may be formed using an in-situ generation process. As an example, in some embodiments, the material of the tunnel layer 150 may be any one of silicon oxide, magnesium fluoride, amorphous silicon, polycrystalline silicon, silicon carbide, silicon nitride, silicon oxynitride, aluminum oxide and titanium oxide.

The doped conductive layer 160 is used to form field passivation. In some embodiments, the material of the doped conductive layer 160 may be doped silicon. In some embodiments, the doped conductive layer 160 and the N-type substrate 100 include doping elements of the same conductivity type, the doped silicon may include one or more of N-type doped polysilicon, N-type doped microcrystalline silicon, N-type doped amorphous silicon and silicon carbide. In some embodiments, the doped conductive layer 160 may be formed using a deposition process. As an example, intrinsic polysilicon may be deposited on the surface of the tunnel layer 150 away from the N-type substrate 100 to form a polysilicon layer, and phosphorus ions may be doped in manners of ion implantation and source diffusion to form an N-type doped polysilicon layer. The N-type doped polysilicon layer serves as the doped conductive layer 160.

Referring to FIG. 1, in some embodiments, the method further includes forming a first passivation layer 170 on a surface of the doped conductive layer 160 away from the N-type substrate 100. In some embodiments, the material of the first passivation layer 170 may be one or more of magnesium fluoride, silicon oxide, aluminum oxide, silicon oxynitride, silicon nitride and titanium oxide. In some embodiments, the first passivation layer 170 may be a single-layer structure. In some other embodiments, the first passivation layer 170 may be a multi-layer structure. As an example, in some embodiments, the first passivation layer 170 may be formed using a PECVD method.

In some embodiments, the method further includes forming a second metal electrode 180 penetrating the first passivation layer 170 to form an electrical connection with the doped conductive layer 160. As an example, the method for forming the second metal electrode 180 may be the same as the method for forming the first metal electrode 140, and the material of the first metal electrode 140 may be the same as the material of the second metal electrode 180.

In the production method for a solar cell as provided by the above embodiments, the at least one edge of each formed first pyramid structure 1 has irregular deformation, and a spherical or spherical-like substructure 14 is formed on each of top surfaces of at least a part of the first pyramid structures 1, so that the first pyramid structures 1 have micro-defects, and changes in silicon crystals are formed in the first portion 11 of the P-type emitter. Furthermore, edges of each second pyramid structure 2 are straight, in other words, there is no deformation in the edges of each second pyramid structure 2. Due to the micro-defects of the first pyramid structures 1, the sheet resistance of the first portion 11 is much less than the sheet resistance of the second portion 12, thereby greatly improving ohmic contact of the first portion 11 of the P-type emitter 10. Meanwhile, the doping concentration of the first portion 11 of the P-type emitter 10 is kept low, so that the generations of recombination centers in the first portion 11 of the P-type emitter 10 can be reduced, the good passivation effect of the P-type emitter 10 can be maintained, and the generations of Auger recombination can be reduced. In this way, the photoelectric conversion performance of the solar cell can be improved.

Comparative Example

The comparative example provides a solar cell, including: a substrate; an emitter formed on a first surface of the substrate, the emitter includes a first portion 11 (refer to FIG. 1) and a second portion 12 (refer to FIG. 1), a top surface of the first portion 11 includes a third pyramid structure whose edges are straight, and a top surface of the second portion 12 includes a fourth pyramid structure whose edges are straight. A doping concentration of the first portion 11 is greater than a doping concentration of the second portion 12, and a sheet resistance of the first portion 11 is lower than a sheet resistance of the second portion 12.

Compared with the structure of the solar cell according to embodiments of the present disclosure as shown in FIG. 1, the difference between the structure of the solar cell according to the comparative example and that according to the embodiments of the present disclosure lies in that, in the comparative example, the edges of the third pyramid structure on the top surface of the first portion are straight. Based on comparative experiment, the parameters according to the embodiments of the present disclosure and those according to the comparative example are compared as shown in Table 1:

TABLE 1

|  | Open-circuit voltage Uoc (V) | Short-circuit current density Jsc (mA/cm$^2$) | Filling factor FF (%) | Conversion efficiency Eff (%) |
| --- | --- | --- | --- | --- |
| Embodiments of the present disclosure | 0.720 | 41.81 | 83.3 | 25.07 |
| Comparative example | 0.713 | 41.62 | 83.2 | 24.69 |

It can be seen from Table 1 that, compared with the comparative example, each of the open-circuit voltage, short-circuit current density, filling factor and conversion efficiency of the solar cell according to embodiments of the present disclosure is higher, so that the solar cell according to embodiments of the present disclosure has a better conversion performance. It can be seen that, due to the micro-defects of the first pyramid structures 1, the sheet resistance of the first portion 11 (refer to FIG. 1) is greatly reduced, thereby greatly improving ohmic contact of the first portion 11 of the P-type emitter 10 (refer to FIG. 1). Meanwhile, the doping concentration of the first portion 11 of the P-type emitter 10 is relatively low, so that the generations of recombination centers in the first portion 11 of the P-type emitter 10 can be reduced, a good passivation effect of the P-type emitter 10 can be maintained, and the generations of Auger recombination can be reduced. In this way, the photoelectric conversion performance of the solar cell can be improved.

Although the present disclosure is disclosed above with exemplary embodiments, they are not used to limit the claims. Any person skilled in the art can make some possible changes and modifications without departing from the concept of the present disclosure. The scope of protection of the present disclosure shall be subject to the scope defined by the claims.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure. Therefore, the patent protection scope of the present disclosure shall still be subject to the scope limited by the appended claims.

What is claimed is:

1. A solar cell, comprising:
    an N-type substrate;
    a P-type emitter formed on a first surface of the N-type substrate; and
    a tunnel layer and a doped conductive layer sequentially formed over a second surface of the N-type substrate in a direction away from the N-type substrate;
    wherein the P-type emitter comprises a first portion and a second portion, the first portion has first pyramid structures formed on a top surface of the first portion and the second portion has second pyramid structures formed on a top surface of the second portion;
    wherein a transition surface is respectively formed on at least one edge of each first pyramid structure, the at least one edge has irregular deformation, the transition surface is joined with two adjacent inclined surfaces of the each first pyramid structure, and the transition surface is concave or convex relative to a center of the each first pyramid structure;
    wherein a substructure is formed on each of top surfaces of at least a part of the first pyramid structures, and a shape of the substructure is spherical or spherical-like;
    wherein edges of each second pyramid structure are straight; and
    wherein a sheet resistance of the first portion ranges from 10 ohm/sq to 500 ohm/sq, a doping concentration at the top surface of the first portion ranges from $1E^{17}$ atoms/cm$^3$ to $8E^{19}$ atoms/cm$^3$; a sheet resistance of the second portion ranges from 100 ohm/sq to 1000 ohm/sq, and a doping concentration at the top surface of the second portion ranges from $1E^{16}$ atoms/cm$^3$ to $5E^{19}$ atoms/cm$^3$.

2. The solar cell according to claim 1, wherein heights of the first pyramid structures range from 0.1 μm to 5 μm, and sizes of bottoms of the first pyramid structures range from 0.5 μm to 5 μm in any one dimension.

3. The solar cell according to claim 1, wherein a doping element in the first portion of the P-type emitter is of a same conductivity type as a doping element in the second portion of the P-type emitter, and the doping element in the first portion and the doping element in the second portion are each a trivalent element, and wherein the doping element in the first portion and the doping element in the second portion each comprise boron or gallium.

4. The solar cell according to claim 1, wherein the sheet resistance of the first portion is lower than the sheet resistance of the second portion.

5. The solar cell according to claim 1, wherein the doping concentration at the top surface of the first portion is not less than the doping concentration at the top surface of the second portion.

6. The solar cell according to claim 1, wherein a junction depth of the first portion is not less than a junction depth of the second portion.

7. The solar cell according to claim 6, wherein a ratio of the junction depth of the first portion to the junction depth of the second portion is not less than 2, and wherein the junction depth of the first portion ranges from 0.2 μm to 10 μm, and the junction depth of the second portion ranges from 0.05 μm to 5 μm.

8. The solar cell according to claim 1, wherein a difference between the doping concentration at the top surface of the first portion and a doping concentration at a bottom surface of the first portion ranges from $8E^{19}$ atoms/cm$^3$ to $1E^{17}$ atoms/cm$^3$, and wherein a difference between the doping concentration at the top surface of the second portion and a doping concentration at a bottom surface of the second portion ranges from $5E^{19}$ atoms/cm$^3$ to $1E^{16}$ atoms/cm$^3$.

9. The solar cell according to claim 1, wherein at least a part of at least one inclined surface of the each first pyramid structure is concave or convex relative to a center of the each first pyramid structure.

10. The solar cell according to claim 1, further comprising a first metal electrode, wherein the first metal electrode is formed on the first surface of the N-type substrate, and is electrically connected to the first portion of the P-type emitter, and wherein a width of the first metal electrode is less than or equal to a width of the first portion of the P-type emitter.

11. A photovoltaic module, comprising:
- a cell string including a plurality of solar cells, wherein the plurality of solar cells are electrically connected in sequence;
- an encapsulation layer configured to cover a surface of the cell string; and
- a cover plate configured to cover a surface of the encapsulation layer facing away from the cell string;
- wherein each of the plurality of solar cells comprise:
- an N-type substrate;
- a P-type emitter formed on a first surface of the N-type substrate; and
- a tunnel layer and a doped conductive layer sequentially formed over a second surface of the N-type substrate in a direction away from the N-type substrate;
- wherein the P-type emitter comprises a first portion and a second portion, the first portion has first pyramid structures formed on a top surface of the first portion and the second portion has second pyramid structures formed on a top surface of the second portion;
  - wherein a transition surface is respectively formed on at least one edge of each first pyramid structure, the at least one edge has irregular deformation, the transition surface is joined with two adjacent inclined surfaces of the each first pyramid structure, and the transition surface is concave or convex relative to a center of the each first pyramid structure;
  - wherein a substructure is formed on each of top surfaces of at least a part of the first pyramid structures, and a shape of the substructure is spherical or spherical-like;
  - wherein edges of each second pyramid structure are straight; and
  - wherein a sheet resistance of the first portion ranges from 10 ohm/sq to 500 ohm/sq, a doping concentration at the top surface of the first portion ranges from $1E^{17}$ atoms/cm$^3$ to $8E^{19}$ atoms/cm$^3$; a sheet resistance of the second portion ranges from 100 ohm/sq to 1000 ohm/sq, and a doping concentration at the top surface of the second portion ranges from $1E^{16}$ atoms/cm$^3$ to $5E^{19}$ atoms/cm$^3$.

12. The photovoltaic module according to claim 11, wherein heights of the first pyramid structures range from 0.1 μm to 5 μm, and sizes of bottoms of the first pyramid structures range from 0.5 μm to 5 μm in any one dimension.

13. The photovoltaic module according to claim 11, wherein a doping element in the first portion of the P-type emitter is of a same conductivity type as a doping element in the second portion of the P-type emitter, and the doping element in the first portion and the doping element in the second portion are each a trivalent element, and wherein the doping element in the first portion and the doping element in the second portion each comprise boron or gallium.

14. The photovoltaic module according to claim 11, wherein the sheet resistance of the first portion is lower than the sheet resistance of the second portion.

15. The photovoltaic module according to claim 11, wherein the doping concentration at the top surface of the first portion is not less than the doping concentration at the top surface of the second portion.

16. The photovoltaic module according to claim 11, wherein a junction depth of the first portion is not less than a junction depth of the second portion.

17. The photovoltaic module according to claim 16, wherein a ratio of the junction depth of the first portion to the junction depth of the second portion is not less than 2, and wherein the junction depth of the first portion ranges from 0.2 μm to 10 μm, and the junction depth of the second portion ranges from 0.05 μm to 5 μm.

18. The photovoltaic module according to claim 11, wherein a difference between the doping concentration at the top surface of the first portion and a doping concentration at a bottom surface of the first portion ranges from $8E^{19}$ atoms/cm$^3$ to $1E^{17}$ atoms/cm$^3$, and wherein a difference between the doping concentration at the top surface of the second portion and a doping concentration at a bottom surface of the second portion ranges from $5E^{19}$ atoms/cm$^3$ to $1E^{16}$ atoms/cm$^3$.

19. The photovoltaic module according to claim 11, wherein at least a part of at least one inclined surface of the each first pyramid structure is concave or convex relative to a center of the each first pyramid structure.

20. The photovoltaic module according to claim 11, wherein each of the plurality of solar cells further comprise a first metal electrode, wherein the first metal electrode is formed on the first surface of the N-type substrate, and is electrically connected to the first portion of the P-type emitter, and wherein a width of the first metal electrode is less than or equal to a width of the first portion of the P-type emitter.

* * * * *